(12) United States Patent
Yang

(10) Patent No.: US 7,505,118 B2
(45) Date of Patent: Mar. 17, 2009

(54) WAFER CARRIER

(75) Inventor: Chen-Hsiung Yang, Taipei Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 38 days.

(21) Appl. No.: 10/711,882

(22) Filed: Oct. 12, 2004

(65) Prior Publication Data

US 2006/0017907 A1    Jan. 26, 2006

(30) Foreign Application Priority Data

Jul. 21, 2004    (TW)    ............... 93121813 A

(51) Int. Cl.
G03B 27/58    (2006.01)
H01L 21/683    (2006.01)

(52) U.S. Cl. ........................ 355/72; 361/234

(58) Field of Classification Search .................. 355/53, 355/72–76; 361/234; 430/5, 30, 20, 138, 430/12
See application file for complete search history.

(56) References Cited

U.S. PATENT DOCUMENTS

| | | | |
|---|---|---|---|
| 4,480,284 A * | 10/1984 | Tojo et al. ................ | 361/234 |
| 4,766,515 A * | 8/1988 | Bollen et al. ................ | 361/234 |
| 5,166,856 A * | 11/1992 | Liporace et al. ............. | 361/233 |
| 5,515,167 A | 5/1996 | Ledger | |
| 5,777,838 A * | 7/1998 | Tamagawa et al. .......... | 361/234 |
| 5,864,459 A * | 1/1999 | Lu et al. ..................... | 361/234 |
| 6,166,897 A * | 12/2000 | Matsunaga .................. | 361/234 |
| 6,169,652 B1 * | 1/2001 | Klebanoff .................... | 361/234 |
| 6,747,282 B2 * | 6/2004 | Kroon et al. ............. | 250/492.2 |
| 6,864,957 B2 * | 3/2005 | Van Elp et al. ................ | 355/53 |
| 2003/0029565 A1 * | 2/2003 | Suzuki et al. ............ | 156/345.3 |
| 2003/0134578 A1 * | 7/2003 | Strasbaugh et al. ........... | 451/41 |
| 2004/0012767 A1 * | 1/2004 | Van Elp et al. ................ | 355/72 |

FOREIGN PATENT DOCUMENTS

JP    2004-207644    7/2004

* cited by examiner

*Primary Examiner*—Hung Henry Nguyen
(74) *Attorney, Agent, or Firm*—Winston Hsu

(57) ABSTRACT

A wafer carrier for carrying a wafer includes a transparent base and a conducting layer. The transparent base has dimensions similar to that of the wafer, and bonds the wafer with a bonding layer. The conducting layer is transparent, and can be attracted by an electrostatic chuck so that the electrostatic chuck can deliver the wafer.

20 Claims, 3 Drawing Sheets

WAFER CARRIER

BACKGROUND OF INVENTION

1. Field of the Invention

The present invention relates to a wafer carrier, and more particularly, to a wafer carrier adapted for use in a double-sided process.

2. Description of the Prior Art

Very large scale integration (VLSI) fabrication is based on a semiconductor wafer, and implemented with tens of, or even hundreds of, semiconductor processes so as to form a plurality of dies having devices and connections therein. These dies are then segmented and packaged to form a plurality of chips for different applications. Therefore, the wafer has to be transferred among reaction chambers of different apparatuses for undergoing different semiconductor processes, such as thin film deposition process, lithography process, etching process, polishing process, etc.

Normally, the wafer is sucked by a vacuum chuck, and transferred among different apparatuses. Please refer to FIG. 1, which is a schematic diagram of a wafer 10 carried by a vacuum chuck 12. As shown in FIG. 1, the wafer 10 is sucked by the vacuum chuck 12 for being loaded in or out of different apparatuses for performing different processes. The vacuum chuck 12 has a plurality of openings 14 communicating with each other, and a pump (not shown). The openings 14 are vacuumed with the pump (not shown) so as to suck the wafer 10 to be positioned on the surface of the vacuum chuck 12.

While the wafer 10 undergoes single-sided processes, the vacuum chuck 12 is able to provide a good fastening effect. However, as the design of semiconductor devices becomes complicated, more and more devices or structures, such as print heads, chip scale packages, MEMS structures, have to be formed by double-sided processes. In such a case, when the front side pattern is formed, the wafer 10 has to be turned over, sucked by the vacuum chuck 12 on the front side, and undergoes back side processes. Consequently, the front side pattern may impede the fastening effect of the vacuum chuck 12, and the front side pattern may be damaged by the vacuum chuck 12 during transportation. Particularly in the case of forming MEMS devices, the wafer 10 is easier to be damaged during the transportation due to its thickness (less than 300 μm). In addition, MEMS devices frequently have through-hole structures, and thus cannot be delivered by the vacuum chuck 12.

Please refer to FIG. 2 and FIG. 3. FIG. 2 and FIG. 3 are schematic diagrams illustrating a wafer 20 carried by an electrostatic chuck (E chuck) 30, where FIG. 2 illustrates the E chuck 30 carrying the wafer 20 from the back side 24, and FIG. 3 illustrates the E chuck 30 carrying the wafer 20 from the front side 22. As shown in FIG. 2, the back side 24 of the wafer 20 is bonded to a carrier wafer 28 with a bonding layer 26, and the E chuck 30 is used to attract the bottom of the carrier wafer 28 and deliver the wafer 20. The carrier wafer 28 is normally a bare wafer, and the bonding layer 26 works to bond the wafer 20 and the carrier wafer 28. The wafer 20 is therefore delivered between each apparatus, and undergoes different processes to form a front side pattern 22A in the front side 22. As described earlier, many semiconductor devices or MEMS devices have to be completed by double-sided processes, thus the bonding layer 26 is then removed, and the wafer 20 is turned over to form a back side pattern 24A in the back side 24 of the wafer 20.

As shown in FIG. 3, when the front side pattern 22A is formed, the wafer 20 is turned over and bonded to the carrier wafer 28 with another bonding layer 32 in the front side 22. The carrier wafer 28, which carries the wafer 20, is then attracted by the E chuck 30, and delivered to different apparatuses to form the back side pattern 24A. It should be appreciated that in the process of defining the back side pattern 24A, such as a lithography process, accurate alignment is required to ensure device reliability. Normally, the wafer 20 has several alignment marks in the front side 22 so that the apparatus can accurately align the wafer 20 by using the alignment marks as a basis during the back side process. However, the conventional method of supporting the wafer 20 using the carrier wafer 28 is not allowed for performing the alignment action, and thus it is easy to cause deviation of the back side pattern 24A. As shown in FIG. 3, the back side pattern 24A of the wafer 20 deviates from the predetermined center line.

Due to the aforementioned drawbacks, a wafer carrier able to deliver the wafer stably without interfering with the alignment action is necessary.

SUMMARY OF INVENTION

It is therefore a primary object of the present invention to provide a wafer carrier for solving the aforementioned problems.

According to a preferred embodiment of the present invention, a wafer carrier for carrying a wafer is disclosed. The wafer carrier includes a transparent base and a conducting layer. The transparent base has dimensions similar to that of the wafer, and utilizes a bonding layer to bond the wafer. The conducting layer is transparent, and can be attracted by an electrostatic chuck (E chuck) so that the E chuck can deliver the wafer among different apparatuses.

The wafer carrier of the present invention can be attracted and delivered by the E chuck. In addition, the transparent base and the transparent conducting layer of the wafer carrier allows the apparatus to perform an alignment action during double-sided processes so that the front side pattern and the back side pattern of the wafer are accurately aligned. Furthermore, since the wafer carrier has similar dimensions as the wafer, the wafer carrier can be loaded and fastened by current equipment of the apparatus without requiring any modifications.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
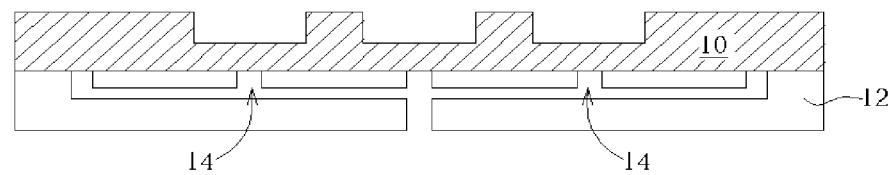
FIG. 1 is a schematic diagram of a wafer carried by a vacuum chuck.
Figure 2:
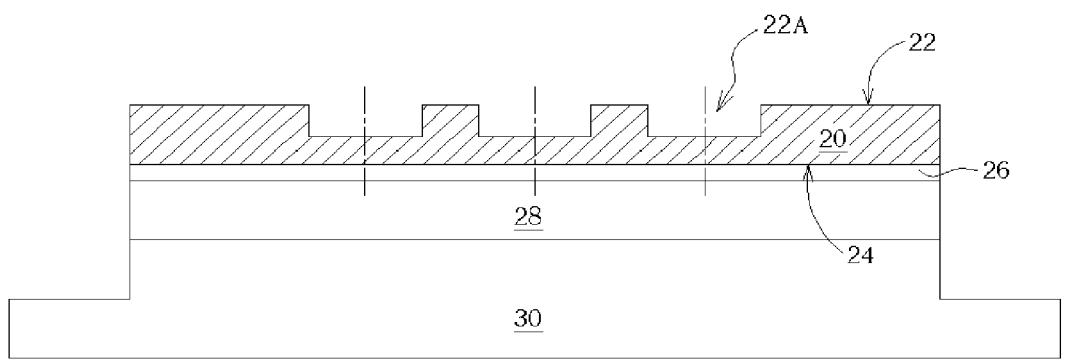
FIG. 2 and FIG. 3 are schematic diagrams illustrating a wafer carried by an electrostatic chuck.
Figure 3:
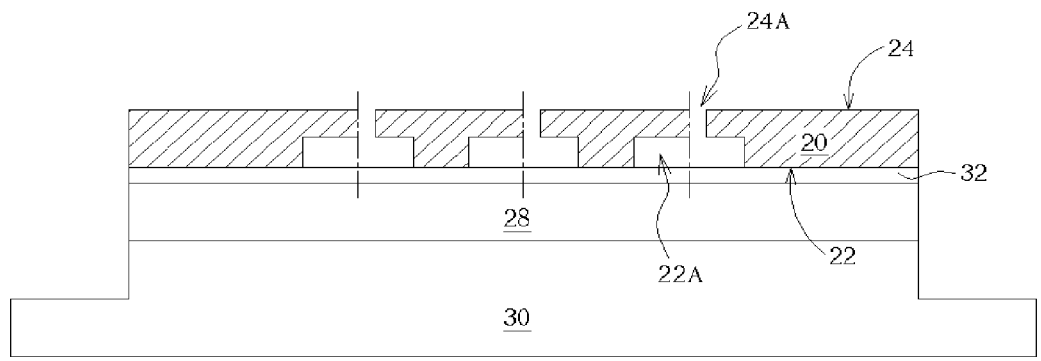
Figure 4:
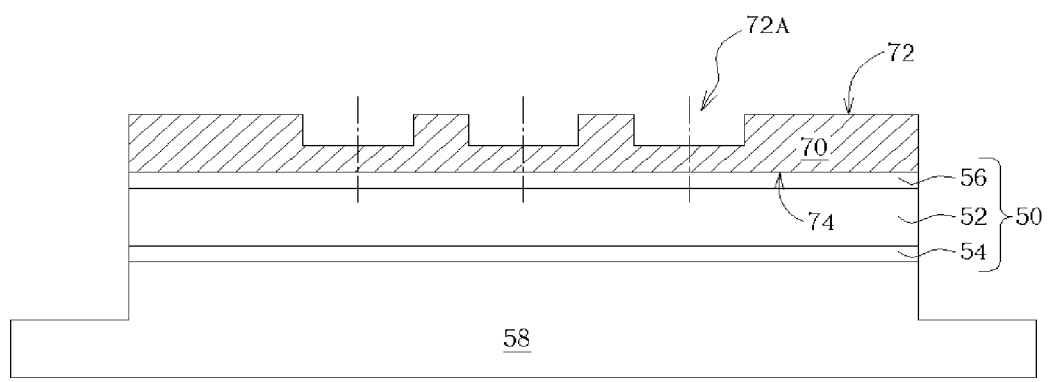
FIG. 4 and FIG. 5 are schematic diagrams of a wafer carrier according to a preferred embodiment of the present invention.
Figure 5:
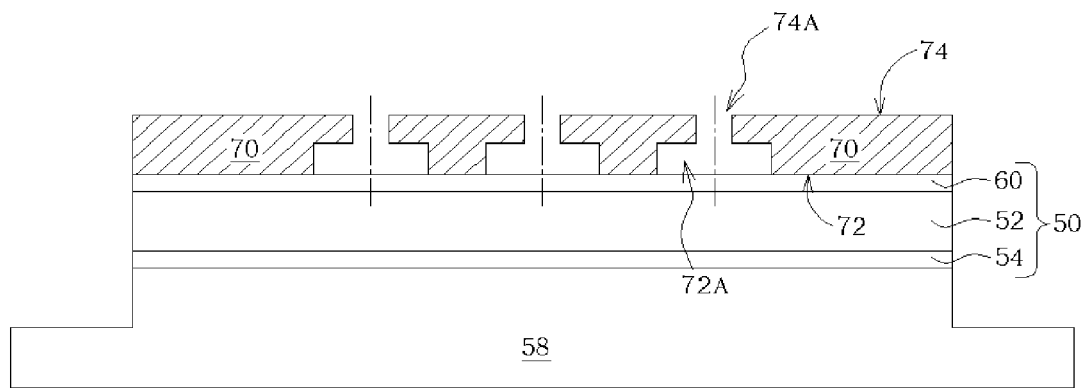

Please refer to FIG. 4 and FIG. 5. FIG. 4 and FIG. 5 are schematic diagrams of a wafer carrier 50 according to a preferred embodiment of the present invention, where FIG. 4 illustrates the wafer carrier 50 carrying a wafer 70 from a back side 74, and FIG. 5 illustrates the wafer carrier 50 carrying the wafer 70 from a front side 72. As shown in FIG. 4, when performing a front side process, the wafer carrier 50 supports the wafer 70 from the back side 74. The wafer carrier 50 includes a transparent base 52 and a conducting layer 54. It will be appreciated that in this embodiment, the transparent base 52 is composed of glass, quartz, or other transparent materials, and has similar dimensions as the wafer 70. The conducting layer 54 is selected from transparent materials, such as indium tin oxide (ITO), indium zinc oxide (IZO), etc. The transparent base 52 bonds the wafer 70 with a bonding layer 56, and the conducting layer 54 can be attracted by an E chuck 58 so that the wafer 70 and the wafer carrier 50 are delivered among different apparatuses. The bonding layer 56 is selected from double-sided tape, ultra violet tape, thermal sensitive tape, photo resist, and wax according to bonding effect and removing convenience. When the wafer carrier 50 and the wafer 70 are transferred to each apparatus by the E chuck 58, different fastening means, such as mechanical clip, vacuum chuck, or E chuck, are utilized according to different apparatus designs. The wafer carrier 50 and the wafer 70 are then loaded in the apparatus to form a front side pattern 72A.

When the front side pattern 72A is formed, the wafer 70 will be turned over to perform back side processes. As shown in FIG. 5, the bonding layer (not shown) is removed so that the wafer 70 and the transparent base 52 are separated apart, and the transparent base 52 and the front side 72 of the wafer 70 are bonded with another bonding layer 60. The E chuck 58 then attracts the conducting layer 54, and delivers the wafer carrier 50 and the wafer 70 to different apparatuses for performing the back side process. As described, different fastening means, such as mechanical clip, vacuum chuck, or E chuck, are utilized to load the wafer carrier 50 as well as the wafer 70 to perform the back side process. It is to be noted that an alignment action will be performed to ensure that the back side pattern 74A to be formed has good accuracy. In this embodiment, both the transparent base 52 and the conducting layer 54 are transparent, and thus would not interfere with the alignment action.

It can be seen that the wafer carrier 50 utilizes a transparent base 52 and a conducting layer composed of transparent conducting materials. Consequently, not only can the conducting layer 54 be effectively attracted by the E chuck 58, but also the alignment action can be implemented by taking the alignment marks positioned on the surface of the wafer 50 as a basis. Accordingly, the front side pattern 72A and the back side pattern 74A are accurately aligned. It will be also appreciated that the conducting layer 54 is not restricted to be transparent, and other non-transparent conducting materials, such as metal, can be selected for enhancing the fastening effect of the E chuck 58. In such a case, the conducting layer 54 must includes at least an exposed region to expose the alignment mark position on the front side 72 of the wafer 70, so that the alignment action in the back side processes can be performed via the exposed region. In addition, the positions and amounts of the alignment marks can be located in the front side 72 and the back side 74 of the wafer 70 regarding different processes to be formed and different apparatuses requirements.

Figure 6:
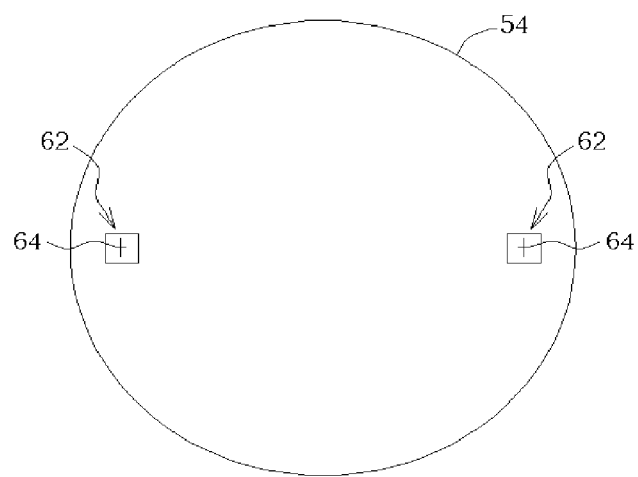
FIG. 6 is a schematic diagram illustrating the conducting layer of the wafer carrier according to another embodiment of the present invention.

Please refer to FIG. 6, which is a schematic diagram illustrating the conducting layer 54 of the wafer carrier 50 according to another embodiment of the present invention. As shown in FIG. 6, the conducting layer 54 is composed of metal materials, and thus the conducting layer 54 includes at least an exposed region 62 to expose the alignment marks 64 marked on the wafer (not shown). Accordingly, the apparatus is able to perform the alignment action during the back side process. It is to be appreciated that the conducting layer 54 has to be entirely connected to ensure the fastening effect of the E chuck (not shown).

In comparison with the prior art, the wafer carrier includes a transparent base and a transparent conducting layer (or alternatively a metal layer having exposed regions). As a result, not only is the wafer carrier stably fastened by the E chuck during transportation, but also the alignment action can be performed during double-sided processes. In addition, the wafer carrier has the same dimensions as the wafer, and thus can be loaded by the loading means of apparatuses without making any modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer carrier for carrying a wafer, comprising:
   a transparent base;
   a conducting layer positioned on a bottom surface of the transparent base; and
   a bonding layer positioned on a top surface of the wafer carrier for bonding the wafer and the transparent base together;
   wherein the conducting layer of the wafer carrier is attracted to an electrostatic chuck via electrostatic force.

2. The wafer carrier of claim 1, wherein the transparent base has dimensions similar to that of the wafer.

3. The wafer carrier of claim 1, wherein the transparent base is a glass wafer.

4. The wafer carrier of claim 1, wherein the transparent base is a quartz wafer.

5. The wafer carrier of claim 1, wherein the bonding layer is selected from the group consisting of double-sided tape, ultra violet tape, thermal sensitive tape, photo resist, and wax.

6. The wafer carrier of claim 1, wherein the wafer is transferred and undergoes at least a semiconductor process.

7. The wafer carrier of claim 6, wherein the semiconductor process is a double-sided process, and the wafer comprises at least an alignment mark.

8. The wafer carrier of claim 7, wherein the conducting layer is a transparent conducting layer.

9. The wafer carrier of claim 7, wherein the conducting layer is a non-transparent conducting layer having at least an exposed region corresponding to the alignment mark.

10. The wafer carrier of claim 9, wherein the non-transparent conducting layer comprises a plurality of conducting patterns connected with each other.

11. A wafer carrier adapted for use in a double-sided process for carrying a wafer, comprising:
   a transparent base;
   a conducting layer positioned on a bottom surface of the transparent base, wherein the conducting layer of the wafer carrier is attracted to an electrostatic chuck via electrostatic force; and
   a bonding layer positioned on a top surface of the transparent base for bonding the wafer and the transparent base.

12. The wafer carrier of claim 11, wherein the transparent base has dimensions similar to that of the wafer.

13. The wafer carrier of claim 11, wherein the transparent base is a glass wafer.

14. The wafer carrier of claim 11, wherein the transparent base is a quartz wafer.

15. The wafer carrier of claim 11, wherein the bonding layer is selected from the group consisting of double-sided tape, ultra violet tape, thermal sensitive tape, photo resist, and wax.

16. The wafer carrier of claim 11, wherein the wafer is transferred and undergoes the double-sided process.

17. The wafer carrier of claim 16, wherein the wafer comprises at least an alignment mark.

18. The wafer carrier of claim 17, wherein the conducting layer is a transparent conducting layer.

19. The wafer carrier of claim 17, wherein the conducting layer is a non-transparent conducting layer having at least an exposed region corresponding to the alignment mark.

20. The wafer carrier of claim 19, wherein the non-transparent conducting layer comprises a plurality of conducting patterns connected with each other.

* * * * *